United States Patent [19]

Scott

[11] 4,071,773

[45] Jan. 31, 1978

[54] PATCH CORD TIMER

[75] Inventor: Charles E. Scott, Noblesville, Ind.

[73] Assignee: P. R. Mallory & Co. Inc., Indianapolis, Ind.

[21] Appl. No.: 715,293

[22] Filed: Aug. 18, 1976

[51] Int. Cl.² .............................................. G08B 1/00
[52] U.S. Cl. .................................................. 307/141
[58] Field of Search ................... 307/141, 141.4, 141.8, 307/11; 219/395, 398; 340/309.2, 309.3, 309.4, 309.1

[56] References Cited

U.S. PATENT DOCUMENTS 3,767,937 10/1973 Schmidgall .......................... 307/141
3,973,135 8/1976 Scott .................................... 307/141

Primary Examiner—Herman J. Hohauser
Attorney, Agent, or Firm—Hoffmann, Meyer & Coles

[57] ABSTRACT

A timer wherein the timing means of said timer includes an improved patch cord control which consists of the electrical coupling of at least two patch cords and two terminal means to individual power switching means and the grouping of timing resistors into at least two groups each of which consist of timing resistors of equal value for preselecting a maximum number of time intervals utilizing a minimum number of resistors.

11 Claims, 2 Drawing Figures

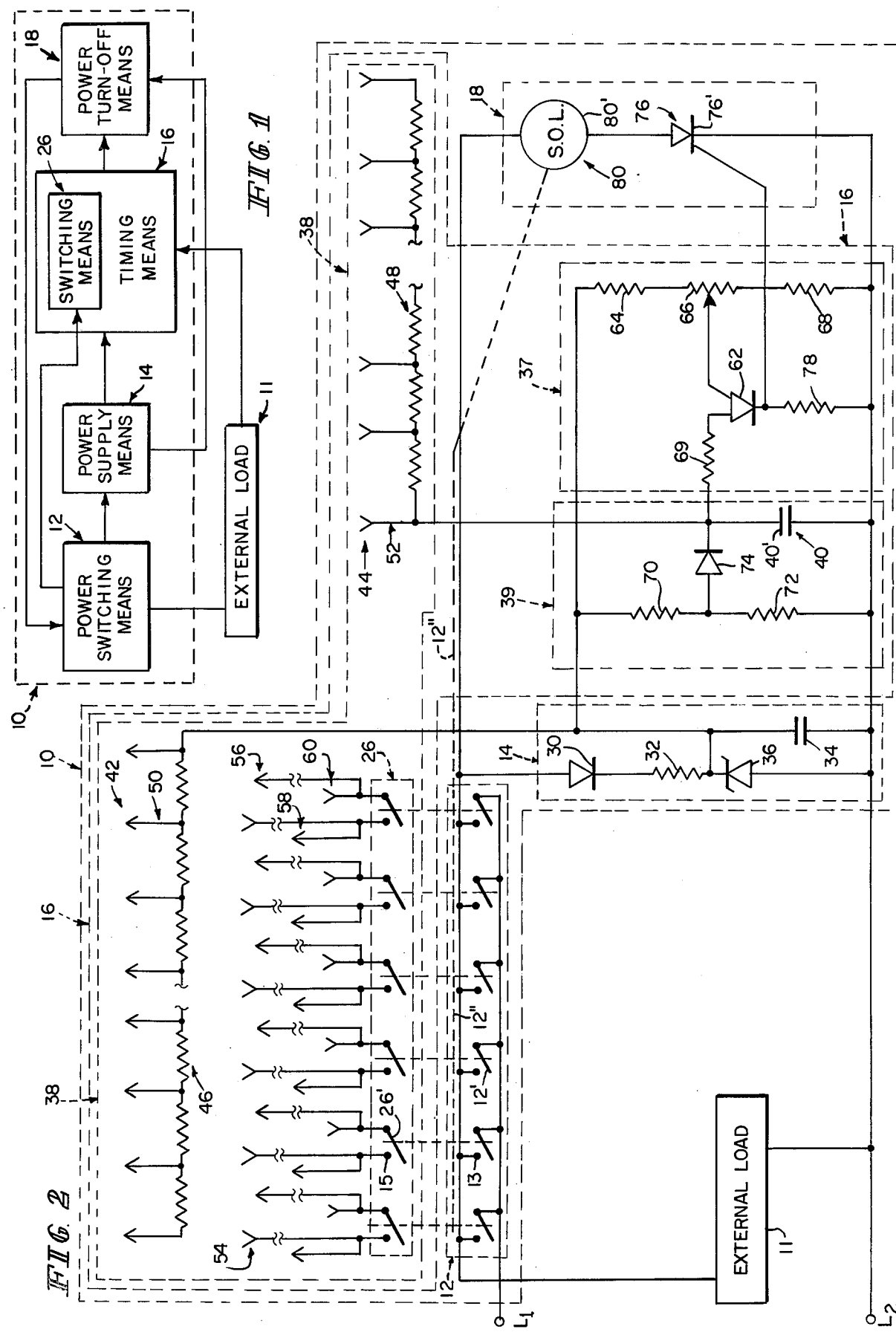

PATCH CORD TIMER

BACKGROUND OF INVENTION

Generally speaking, the present invention relates to a timer which comprises a power switching means, power supply means, timing means, and power turn-off means to de-energize said power switching means. The timing means includes a bank of individual switching means, at least two banks of individual impedance means, at least two patch cords and two terminal means coupling at least one of said individual switching means to at least one impedance means from each of said banks of individual impedance means whereby at least one of said individual switching means has the same preselected timing interval, and capacitance means connected in series to said banks of individual impedance means.

The present invention relates to timers and more particularly to timers wherein patch cords are used to preselect timing intervals. The present invention is an improvement upon Schmidgall U.S. Pat. No. 3,767,937 issued Oct. 23, 1973 which discloses a method of utilizing patch cords to preselect various time intervals in a timer. The method of selecting time intervals in the Schmidgall Patent requires the selection of one timing resistor for each timing interval desired and therefore in order to have the capability of selecting twenty different times the timer required twenty timing resistors. Various applications of timers require the availability of times which are only one second apart covering a wide time span, i.e. up to 240 or more seconds. In addition, many applications require that the same timing intervals be available to time more than one separate function. Referencing the Schmidgall patent, the present state of the art teaches that in order to accommodate times which are only one second apart would require as many timing resistors as seconds within the time span desired, i.e. 240 timing resistors, and that in order to provide the same timing interval to more than one separate function would require a timer having the same capabilities for each function. Through the improved utilization of patch cords and grouping of timing resistors the present invention provides a means for preselecting one second time intervals covering a wide time span using a greatly reduced member of timing resistors and also provides a means for preselecting the same timing interval for at least one separate function utilizing the same timing means.

SUMMARY OF INVENTION

A feature of the present invention is to provide an improved timer capable of providing a wide time span of small timing intervals utilizing a minimal number of resistors. Another feature of the present invention is to provide a timer utilizing at least two groups of timing resistors in order to minimize the number of such resistors required to provide a maximum number of timing intervals. Another feature of the present invention is to provide a timer wherein more than one separate function may be timed for the same time interval. Another feature of the present invention is to proivde a timer wherein improved patch cord control is utilized to allow selection of the same timing interval for more than one separate function. Another feature of the present invention is to provide a timer which allows a maximum number of possible time combinations to be selectable by patch cords, utilizing a minimum number of resistors and terminal plugs. These and other features will become apparent from the description and accompanying drawings which follow.

BRIEF DESCRIPTION OF THE DRAWINGS

FIG. 1 is a block diagram showing the elements of a typical timer connected to an external load wherein patch cords may be utilized to select timing intervals.

FIG. 2 is a schematic diagram showing the timer and more specifically, the improved patch cord control and grouping of timing resistors.

DESCRIPTION OF THE PREFERRED EMBODIMENT

Referring now to the drawings, and particularly to FIG. 1, timer 10 includes power switching means 12, power supply means 14, timing means 16, and power turn-off means 18 wherein power switching means 12, activates an external load 11 such as a microwave oven. As will become apparent, individual functions of external load 11 may be operable for the same or different predetermined periods of time until the power switching means 12 is de-energized through power turn-off means 18. As shown, activation of power switching means 12 activates power supply means 14 which in turn activates timing means 16, timing means 16 operating power turn-off means 18. As will become apparent with reference to FIG. 2, timing means 16 includes a switching means 26. Although switching means 26 is functionally part of timing means 16 the switching means should be constructed unitarily with power switching means 12. Therefore it is shown in FIG. 1 that switching means 26 is activated when power switching means 12 is activated.

Referring to FIG. 2, timer 10 is connected across a suitable external power source at lines $L_1$, $L_2$. Power switching means 12 includes a plurality of switches 12' which may be of the push button type having double contacts. One of the contacts 13 serves as the power switching means 12. The other contact 15 serves as the switching means 26 included as a part of the timing means 16. Power supply means 14 includes a series combination of diode 30, resistor 32, and the parallel combination of capacitor 34 and zener diode 36. The power supply means 14 converts AC current to DC current and maintains a steady voltage which is supplied to the balance of the circuit. Timing means 16 includes a comparator means 37, timing selector means 38 and RC charging network 39. The timing selector means 38 is connected between the power supply means 14 and RC charging network 39 and includes at least two banks of impedance means 42 and 44 such as two banks of timing resistors 46 and 48 respectively. The resistors 46 in impedance bank 42 and resistors 48 in impedance bank 44 are respectfully all of one value corresponding to the timing intervals desired. The resistors 46 are electrically connected to each other in series with male terminal plugs 50 between each resistor. The resistors 48 are electrically connected in series to each other with female terminal plugs 52 between each resistor. The bank of switching means 26 is electrically coupled to female patch cords 54 and male patch cords 56. Two of these patch cords may be used to selectively couple the switching means 26 to the resistors in impedance banks 42 and 44 simultaneously by connecting a female patch cord 54 to a male terminal plug 50 and a male patch cord 56 to a female terminal plug 52. In this manner, various combinations of resistance values representing intervals of time may be obtained so as to provide a maximum number of time periods for the operation of timing means 16. The bank of switching means 26 is also electrically connected to male terminal plugs 58 and female terminal plugs 60 which in turn are connected to a female patch cord 54 and a male patch cord 56 respectively. Utilizing such terminal plugs and patch cords 54 and 56, at least two of the switches 26' may be coupled to the same timing resistors by connecting the female patch cord 54 of a first switch 26' to a selected male terminal plug 50, the female patch cord 54 of a second switch 26' to the male terminal plug 58 of said first switch 26', the male patch cord 56 of said first switch 26' to a selected female terminal plug 52, and the male patch cord 56 of said second switch 26' to the female terminal plug 60 of said first switch 26'.

RC charging network 39 includes resistors 70 and 72, diode 74, and capacitance means 40. Capacitance means 40 includes a timing capacitor 40'. Included as part of the comparator means 37 is a programmable unijunction transistor (PUT) 62 and a voltage divider network comprising resistors 64, 66, and 68 with resistor 66 being a variable resistor. The gate of the programmable unijunction transistor is connected to the variable resistor 66, its anode is connected to impedance bank 44 and the RC charging network 39 through load resistor 69, and its cathode is connected to a switching means 76 of the power turn-off means 18 and to ground through resistor 78. The power turn-off means 18 includes relay means 80 connected in series with switching means 76. Relay means 80 includes a solenoid 80' while switching means 76 includes an SCR 76' connected anode to the solenoid, cathode to ground and gate to the cathode to ground and gate to the cathode of unijuction transistor 62.

In operation, when any one of the number of push buttons (not shown) corresponding to the number of switches 12' and 26' is fully depreseed, two switch contacts on the push button close and the push button is latched in an "ON" position by a spring loaded latch bar 12'' which is connected to solenoid 80'. Contacts 13 for the power switching means 12 control power to an external load 11, power supply 14, RC charging network 39, and voltage divider resistors 64, 66, and 68. Contacts 15 for the switch means 26 connect the preselected timing resistors 46 and 48 between the power supply means 14 and RC charging network 39. The timing resistors from impedance banks 42 and 44 and therefore the time associated with at least one switch 26' are preselected by connecting a female patch cord 54 and a male patch cord 56 from a desired switch 26' to a male terminal plug 58 at a desired resistor 42 and a female terminal plug 60 at a desired resistor 48 respectively. The same time may be preselected for two or more switches 26' by connecting the female patch cord 54 and the male patch cord 56 from a second switch 26' to the male terminal plug 58 and female terminal plug 60 respectively of a first switch 26'. As current flows from power supply means 14 through the timing resistors 46 and 48 and the RC charging network 39 the voltage on timing capacitor 40' reaches a voltage slightly higher than the voltage at resistor 66, PUT 62 conducts until the voltage on the timing capacitor 40' (which is now discharging through PUT 62) reaches the same voltage as the junction voltage drop across PUT 62. When PUT 62 conducts through resistor 78 voltage is generated at the gate of SCR 76' which casues it to conduct. When SCR 76' conducts, current flows through solenoid 80' and activates the latch bar release 12'' which releases the push button. With the push button released, both switch contacts 13 and 15 open de-energizing power supply means 14 thus ending the timing cycle of the timer 10.

For the purposes of this disclosure the term patch cord shall mean a cord equipped with plugs at each end used to connect two termninals.

Also for purposes of this disclosure the term female and male shall mean designed with a hollow into which a corresponding male part fits and designed for fitting into a corresponding hollow part respectively.

What is claimed is:

1. A timer comprising:
   a. power switching means for switching power on and off to the timer,
   b. power supply means for regulating power to the timer responsive to said power switching means,
   c. timing means for preselecting a maximum number of various time intervals responsive to said power supply means including a bank of individual switching means, at least two banks of individual impedance means, a plurality of patch cords and terminal means coupling at least one of said individual switching means to at least one impedance means from each of said banks of individual impedance means whereby at least one of said individual switching means has a preselected timing interval, and capacitance means connected in series to said banks of individual impedance means, and
   d. power turn-off means responsive to said timing means to de-energize said power switching means.

2. A timer according to claim 1 wherein said individual impedance means are resistors.

3. A timer according to claim 2 wherein said resistors are grouped into at least two banks according to different timing increments.

4. A timer according to claim 1 wherein said patch cords comprise at least one male patch cord and one female patch cord connected to each individual switching means.

5. A timer according to claim 4 wherein said terminal means comprise at least one male terminal plug and at least one female terminal plug connected to at least one of said individual switching means and to a female patch cord and a male patch cord respectively of at least another of said individual switching means whereby at least two of said individual switching means have the same preselected timing interval.

6. A timer according to claim 1 wherein said capacitor means is at least one capacitor.

7. A timer according to claim 1 wherein said timing means further includes a comparator means connected to said power supply means through an RC charging network.

8. A timer according to claim 7 wherein said comparator means includes a programmable unijunction transistor.

9. A timer according to claim 1 wherein said power turn-off means includes a second switching means connected to said comparator means and in series with a relay means.

10. A timer according to claim 9 wherein said second switching means includes an SCR and said relay means includes a solenoid.

11. A timer according to claim 1 wherein said power supply means includes a series combination of a diode, resistor, and the parallel combination of a zener diode and capacitor.

* * * * *